United States Patent [19]

Sanderson et al.

[11] Patent Number: 5,109,188
[45] Date of Patent: Apr. 28, 1992

[54] INSTANTANEOUS FREQUENCY MEASUREMENT RECEIVER WITH BANDWIDTH IMPROVEMENT THROUGH PHASE SHIFTED SAMPLING OF REAL SIGNALS

[75] Inventors: Richard B. Sanderson, Dayton; James B. Y. Tsui, Centerville, both of Ohio

[73] Assignee: The United States of America as represented by the Secretary of the Air Force, Washington, DC

[21] Appl. No.: 672,309

[22] Filed: Mar. 6, 1991

[51] Int. Cl.⁵ .............................................. G01R 23/16
[52] U.S. Cl. ................................. 324/77 H; 364/484; 324/77 G; 324/78 D; 324/82
[58] Field of Search ................ 455/304, 214; 342/108, 342/16, 14, 17, 18, 98, 20; 364/724.06, 724.08, 484, 485; 324/77 H, 77 E, 82, 83 Q, 78 D

[56] References Cited

U.S. PATENT DOCUMENTS

| | | | |
|---|---|---|---|
| 3,708,746 | 1/1973 | Willett | 324/77 D |
| 4,106,102 | 8/1978 | DesBlache | 364/724.08 |
| 4,325,068 | 4/1982 | Mercer | 455/304 |
| 4,336,541 | 6/1982 | Tsui . | |
| 4,504,785 | 3/1985 | Tucker | 324/77 H |
| 4,633,516 | 12/1986 | Tsui | 324/78 D |
| 4,893,266 | 1/1990 | Deem . | |
| 4,963,816 | 10/1990 | Tsui | 324/77 H |
| 4,983,906 | 1/1991 | Hiller | 364/484 |

*Primary Examiner*—Kenneth A. Wieder
*Assistant Examiner*—Jose M. Solis
*Attorney, Agent, or Firm*—Bernard E. Franz; Donald J. Singer

[57] ABSTRACT

This is a technique for extending the frequency range which employs a power divider having two outputs, one output being supplied to a first A/D converter, and the other output being supplied via a delay device to a second A/D converter. A processor receives the outputs of the two A/D converters. In operation, the input signal is subjected to a known delay $\tau$ and both original and delayed signals are sampled simultaneously. Both sampled signals are Fourier transformed and the phase and amplitudes calculated, using the expressions:

$$\phi(f) = \tan^{-1}[I(f)/R(f)]$$

$$A(f) = [R^2(f) + I^2(f)]^{\frac{1}{2}}$$

where $R(f)$ and $I(f)$ are respectively the real and imaginary parts of the frequency transform. The phase difference between the original and delayed signals is calculated and an approximation to the true frequency for each peak observed in the amplitude spectrum is estimated using the expression $$\phi = 2\pi f \tau$$

where $\tau$ is the delay.

The technique fails if the value of f is too close to the boundary between aliases or if two signals are degenerate in the lowest alias. To handle these cases another pair of samples at a different $f_s'$ is required to shift the aliases so that the measured value does not lie on a boundary.

2 Claims, 1 Drawing Sheet

INSTANTANEOUS FREQUENCY MEASUREMENT RECEIVER WITH BANDWIDTH IMPROVEMENT THROUGH PHASE SHIFTED SAMPLING OF REAL SIGNALS

RIGHTS OF THE GOVERNMENT

The invention described herein may be manufactured and used by or for the Government of the United States for all governmental purposes without the payment of any royalty.

CROSS REFERENCE TO RELATED APPLICATIONS

This is one of three related applications by the same applicants and all filed on Mar. 6, 1991 (1) Digital Frequency Measurement Receiver With Bandwidth Improvement Through Multiple Sampling of Complex Signals, Ser. No. 07/672,515 (2) Digital Frequency Measurement Receiver With Bandwidth Improvement Through Multiple Sampling of Real Signals, Ser. No. 07/672,310 and (3) Instantaneous Frequency Receiver With Bandwidth Improvement Through Phase Shifted Sampling of Real Signals, Ser. No. 07/672,309.

BACKGROUND OF THE INVENTION

The present invention relates generally to an instantaneous frequency measurement receiver with bandwidth improvement through phase shifted sampling of real signals.

The conventional Instantaneous Frequency Measurement (IFM) receiver is a radio frequency (RF) receiver used primarily in electronic warfare (EW). Its basic function is to measure the frequency of pulsed signals radiated from hostile radar. Generally, it may be said that IFM receivers measure the frequencies of incoming RF signals utilizing interferometric techniques by detecting the phase shift magnitudes produced in multiple, calibrated delay lines. For instance, the received RF signal is divided and simultaneously introduced into a non-delayed path and a delay line of known length. Since the phase differences between the delayed and non-delayed receiver paths are functions of the input signal frequency, conversion of the phase difference signals to video provides signals whose amplitudes are related to the phase delay. These video signals typically take the form sin $\omega\tau$ or cos $\omega\tau$, where $\omega$ is the angular frequency of the L- processed input signal. The sin $\omega\tau$/cos $\omega\tau$ signals are delivered to the encoding network which makes amplitude comparisons of the signals, determines the numerical value of w, and generates the digital frequency descriptive word.

An IFM receiver has many attractive features necessary for EW applications, such as small size, light weight, wide instantaneous bandwidth, and fine frequency resolution.

In a digital rf receiver, the incident radiation is mixed with a local oscillator signal and down converted to an intermediate frequency (IF). This IF signal is discretely sample and further processing is done using digital techniques. The frequency of the incident radiation may be determined by performing a discrete Fourier transform on the sampled signal. The range of frequencies that can be determined by such methods is limited by aliasing effects that limit the frequency range to $f_s/2$, the Nyquist frequency, where $f_s$ is the uniform sample frequency. In order to measure frequencies over a wide range, a very high sampling frequency must be used.

United States patents of interest include U.S. Pat. No. 4,336,541, to Tsui, which teaches an IFM receiver that detects the difference of two or more RF signals between the onset of the first RF signal pulse and the completion of the frequency encoding strobe. U.S. Pat. No. 4,504,785 to Tucker teaches a sampling spectrum analyzer wherein an input signal is split and each resulting portion is passed down a tapped delay line with samples being taken at each tap processed by separate arithmetic units. U.S. Pat. No. 4,633,516 to Tsui teaches an IFM receiver with an A/D converter which permits elimination of a phase correlator. U.S. Pat. No. 3,708,746 to Willet teaches a system for analyzing the frequency of an incident signal including a digital filter wherein the center frequency of the incident signal is varied by changing the sampling rate.

SUMMARY OF THE INVENTION

An objective of the invention is to improve the bandwidth of a digital rf receiver that measures the frequency of an incident signal.

The invention overcomes the problem that in a digital receiver in order to measure frequencies over a wide range a very high sampling frequency must be used.

The device according to the invention for extending the frequency range comprises, a power divider having two outputs, one output being supplied to a first A/D converter, and the other output being supplied via a delay device to a second A/D converter. A processor receives the outputs of the two A/D converters. In operation, the input signal is subjected to a known delay $\tau$ and both original and delayed signals are sampled simultaneously. Both sampled signals are Fourier transformed and the phase and amplitudes calculated, using the expressions:

$$\phi(f) = \tan^{-1}[I(f)/R(f)]$$

$$A(f) = [R^2(f) + I^2(f)]^{\frac{1}{2}}$$

where R(f) and I(f) are respectively the real and imaginary Parts of the frequency transform. The phase difference between the original and delayed signals is calculated and an approximation to the true frequency for each peak observed in the amplitude spectrum is estimated using the expression $$\phi = 2\pi f\tau$$

where $\tau$ is the delay.

The technique fails if the value of the frequency f is too close to the boundary between aliases or if two signals are degenerate in the lowest alias. To handle these cases another pair of samples at a different sampling frequency $f_s'$ is required to shift the aliases so that the measured value does not lie on a boundary.

FIG. 1 is a functional block diagram showing an IFM receiver according to the invention; and FIG. 2 is functional block diagram as in FIG. 1, adding apparatus for sampling at a second frequency.

DETAILED DESCRIPTION

Figure 1:
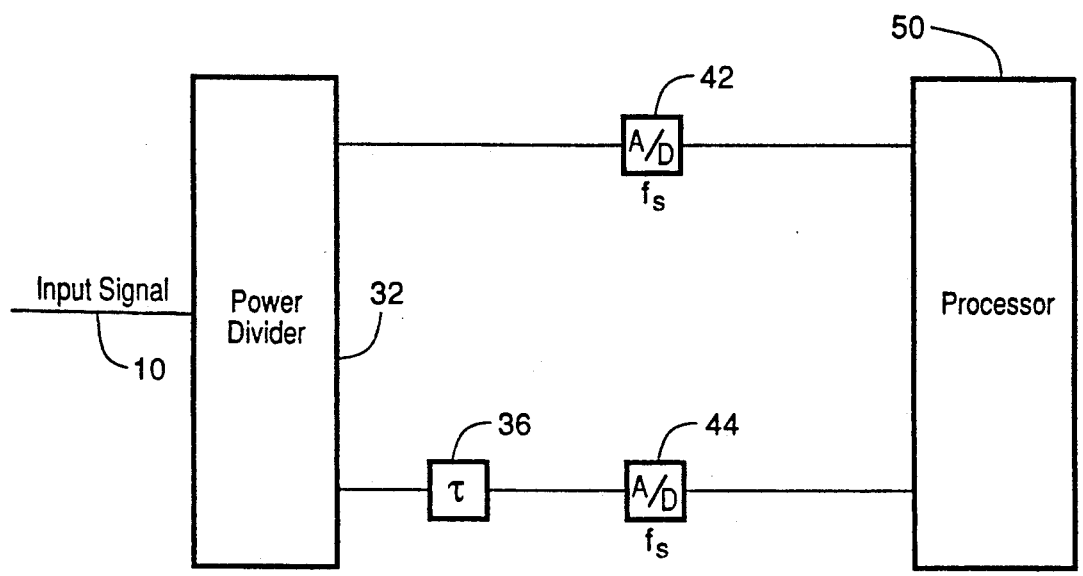

This proposed approach to extending the frequency range is illustrated in FIG. 1. The incoming RF signal on line 10 is divided in power divider 32. One output of the power divider 32 is applied to an analog-to-digital converter 42, and the other is applied via a delay device 36 providing a delay $\tau$ to an analog-to-digital converter 44. The converters 42 and 44 are operated at a sampling frequency $f_s$. The signals from the converters 42 and 44 are then supplied to a processor 50 to determine the frequency f.

In FIG. 1, the signal is subjected to a known delay $\tau$ and both original and delayed signals are sampled simultaneously. In the processor 50, both sampled signals are Fourier transformed and the phase and amplitudes calculated, using the expressions:

$$\phi(f) = \tan^{-1}[I(f)/R(f)]$$

$$A(f) = [R^2(f) + I^2(f)]^{\frac{1}{2}}$$

where R(f) and I(f) are respectively the real and imaginary parts of the frequency transform. The phase difference between the original and delayed signals is calculated and an approximation to the true frequency for each peak observed in the amplitude spectrum is estimated using the expression $$\phi = 2\pi f \tau$$

where $\tau$ is the delay. If the phase shift is less than $\pi$, this procedure permits an estimate of the approximate a value of the true frequency of the signal and, thus, permits determination of the alias which has been mapped to the observed frequency and correction of the observed frequency for aliasing. This may be accomplished in the following manner. Let $f_s$ be the sampling frequency, $f_{ph}$ be the frequency inferred from phase calculations, and f be the aliased frequency obtained from the amplitude spectrum. Repeatedly subtract $f_s$ from $f_{ph}$ until a value less than $f_s/2$ is obtained. If this value of $f_{ph}$ is less than zero, replace f by $-f$ and calculate the corrected value of f to be $$f_{corr} = f + n f_s \quad (4)$$

where n is the number of subtractions performed.

Figure 2:
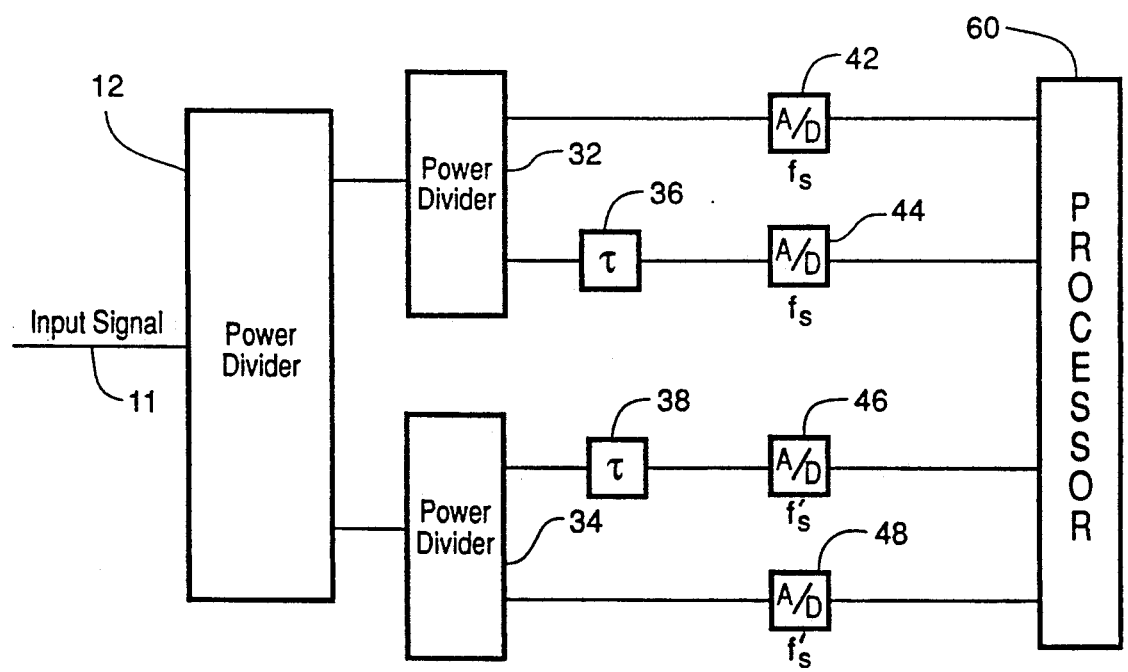

The technique fails if the value of the frequency f is too close to the boundary between aliases or if two signals are degenerate in the lowest alias. To handle these cases another pair of samples at a different sampling frequency $f_s'$, as shown in FIG. 2, is required to shift the aliases so that the measured value does not lie on a boundary. The limitation of the phase shift to $\tau$ is equivalent to a Nyquist limit based on a sample spacing equal to the sample shift.

In FIG. 2, the incoming RF signal on line 11 is divided in power divider 12, and the two output signals supplied to power dividers 32 and 34. The outputs of power divider 32 are applied via the converter 42, and via delay unit 36 and converter 44, to a processor 60, as in FIG. 1. One output of the power divider 34 is applied to an analog-to-digital converter 46, and the other is applied via a delay device 38 providing a delay $\tau$ to an analog-to-digital converter 48. The converters 46 and 48 are operated at a sampling frequency $f_s'$. The signals from the converters 46 and 48 are then supplied to the processor 60, and used along with the outputs of converters 42 and 44, to determine the frequency f.

Summary

This technique permits extending the frequency range by an order of magnitude at the price of a four fold increase in sampling rate. The technique can handle multiple signals without difficulty. The requirement for sampling at a second frequency is characteristic of extended frequency techniques to eliminate discrete degeneracies.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. A frequency measurement receiver comprising:
    power dividing means coupling a source of signals to inputs of first and second analog-to-digital converters, with a delay device providing a delay $\tau$ coupled between the power dividing means and the second analog-to-digital converter; the first and second analog-to-digital converters being operated at a sampling frequency $f_s$, outputs of the first and second analog-to-digital converters being coupled to processing means;
    wherein said processing means comprises means for performing Fourier transforms on signals from the first and second analog-to-digital converters, with the phase and amplitudes calculated, using the expressions:

$$\phi(f) = \tan^{-1}[I(f)/R(f)]$$

$$A(f) = [R^2(f) + I^2(f)]^{\frac{1}{2}}$$

where R(f) and I(f) are respectively the real and imaginary parts of the frequency transform, means for calculating the phase difference between the original and delayed signals and for estimating an approximation to the true frequency for each peak observed in the amplitude spectrum using the expression $$\phi = 2\pi f \tau;$$

means for inferring a frequency $f_{ph}$ from phase calculations, and using an aliased frequency f obtained from the amplitude spectrum, means for obtaining an estimate of the approximate value of the true frequency of the signal and, thus, determination of the alias which has been mapped to the observed frequency and correction of the observed frequency for aliasing, means for repeatedly subtracting the value of the sampling frequency $f_s$ from the value of the frequency $f_{ph}$ until a value less than $f_s/2$ is obtained, if this value of $f_{ph}$ is less than zero, replacing f by $-f$ and calculating the corrected value of f to be $$f_{corr} = f + n f_s$$

where n is the number of subtractions performed.

2. A frequency measurement receiver according to claim 1, further including third and fourth analog-to-digital converters coupled to said power dividing means, with a second delay device providing a delay $\pi$ coupled between the power dividing means and the fourth analog-to-digital converter; the third and fourth analog-to-digital converters being operated at a sampling frequency $f_s'$, outputs of the third and fourth analog-to-digital converters being coupled to said processing means;

wherein said processing means comprises means for performing operations on signals from the third and fourth analog-to-digital converters, corresponding to the said operations performed on signals from the first and second analog-to-digital converters, and means for selecting from the determination of frequency based on signals from the first and second analog-to-digital and from the determination of frequency based on signals from the third and fourth analog-to-digital converters, as required to shift the aliases so that the measured value does not lie on a boundary.

* * * * *